United States Patent
Murata et al.

(10) Patent No.: US 6,552,384 B2
(45) Date of Patent: Apr. 22, 2003

(54) THIN-FILM CAPACITOR ELEMENT AND ELECTRONIC CIRCUIT BOARD ON WHICH THIN-FILM CAPACITOR ELEMENT IS FORMED

(75) Inventors: Shinji Murata, Iwate-ken (JP); Ken Yamamura, Iwate-ken (JP); Mitsuru Tokuta, Iwate-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/898,670

(22) Filed: Jul. 2, 2001

(65) Prior Publication Data

US 2002/0003261 A1 Jan. 10, 2002

(30) Foreign Application Priority Data

Jul. 4, 2000 (JP) .................................... 2000-202394
Jul. 17, 2000 (JP) .................................... 2000-216223

(51) Int. Cl.[7] .......................... H01L 23/62; H01L 29/00
(52) U.S. Cl. ..................... 257/307; 257/535; 257/532; 257/306; 257/303; 257/763
(58) Field of Search ................................ 257/528, 531, 257/532, 533, 534, 535, 359, 632, 634, 309, 763, 303, 306; 361/306.3, 307, 311, 312, 303, 313

(56) References Cited

U.S. PATENT DOCUMENTS 5,812,364 A * 9/1998 Oku et al. .................. 257/306
6,166,424 A * 12/2000 Mikawa et al. ............. 257/532

FOREIGN PATENT DOCUMENTS

JP  8-148795  *  6/1996
JP  9-321166     12/1997

* cited by examiner

Primary Examiner—Nathan J. Flynn
Assistant Examiner—Tan Tran
(74) Attorney, Agent, or Firm—Brinks Hofer Gilson & Lione (57) ABSTRACT

In order to provide an electronic circuit board capable of preventing the breakdown voltage of a capacitor element from dropping and excellent in high frequency performance, a positive type photoresist is spin-coated over the surface of an alumina substrate and is exposed to light and developed to form an insulating layer partially, followed by formation of a capacitor element by successively stacking a lower electrode, a dielectric layer and an upper electrode over this insulating layer, further followed by formation of a resistance element, an inductor element and a transmission line, each in a filmy state, over the surface of the alumina substrate.

6 Claims, 8 Drawing Sheets

THIN-FILM CAPACITOR ELEMENT AND ELECTRONIC CIRCUIT BOARD ON WHICH THIN-FILM CAPACITOR ELEMENT IS FORMED

BACKGROUND OF THE INVENTION

1. Field of the Invention

The present invention relates to a thin-film capacitor element for use in small electronic circuits and an electronic circuit board over which, together with this thin-film capacitor element, thin-film circuit elements, such as inductor elements, are to be formed.

2. Description of the Prior Art

In recent years, along with the advancement of integrated circuit technology, downsizing of electronic circuits is further proceeding, and there have been developed small electronic circuit boards over which capacitors, resistors, inductors and the like are to be formed as thin films.

Substrates for such electronic circuit boards can be made of a monocrystalline material such as sapphire or a sintered material such as alumina. As alumina is relatively inexpensive and excels in high frequency performance among these available materials, high frequency devices extensively use alumina substrates. Over an alumina substrate, various required circuit elements are formed as a set of thin films (hereinafter referred to as being formed in a filmy state). For instance, a capacitor element is configured over an alumina substrate by successively stacking layers of a lower electrode, a dielectric layer and an upper electrode. A resistor element is configured by forming in a filmy state a resistance layer of a desired shape over an alumina substrate and forming, also in a filmy state, electrodes at its two ends. An inductor element is configured by forming in a filmy state a metallic film of a desired shape over an alumina substrate and forming, also in a filmy state, electrodes at its two ends. Further over the alumina substrate path, a transmission line is formed as an electroconductive pattern, and this transmission line is connected to the respective electrodes of the capacitor element, resistor element and inductor element.

Figure 12:
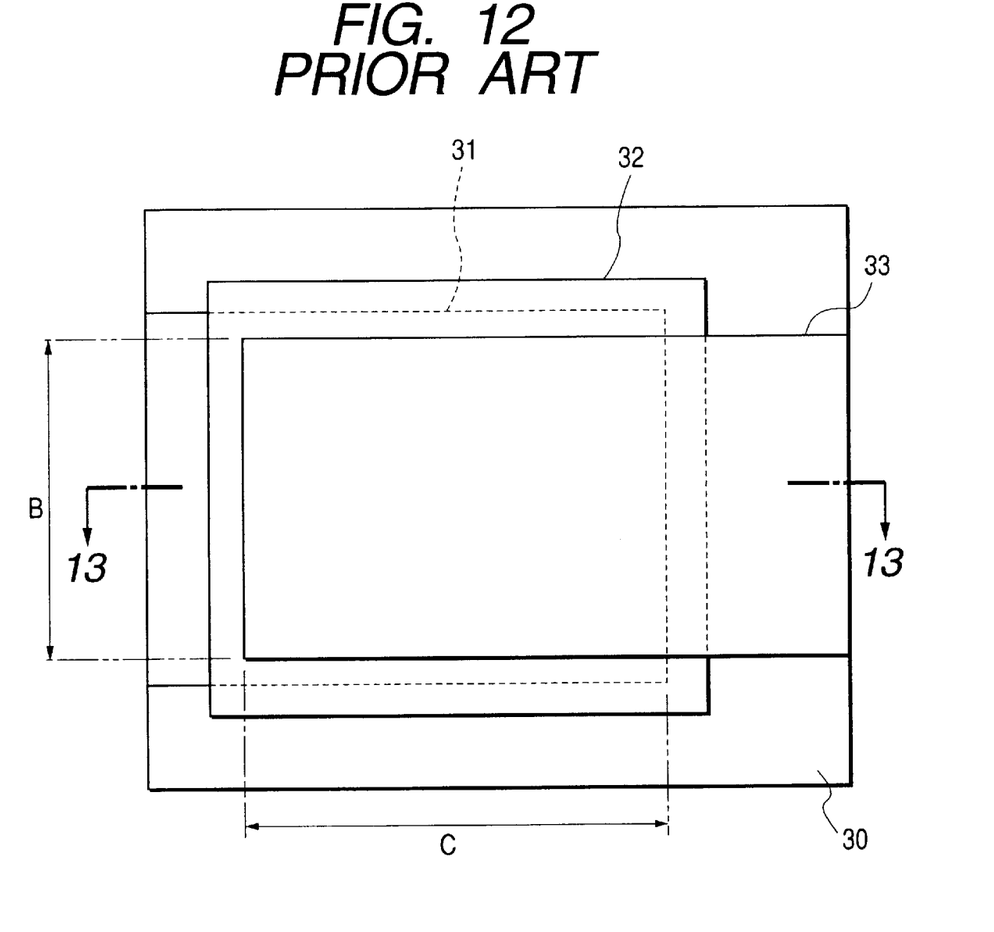
FIG. 12 shows a plan of a thin-film capacitor element according to the prior art.
Figure 13:
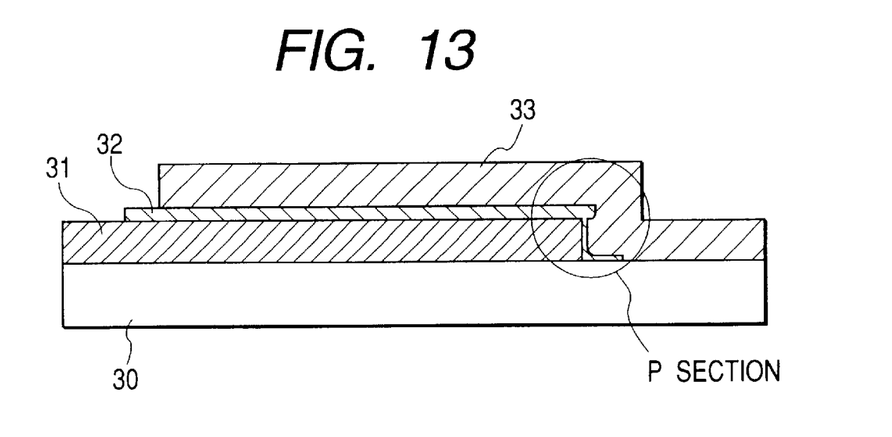
FIG. 13 shows a section along line 13—13 in FIG. 12.

FIG. 12 is a plan of a conventionally known thin-film capacitor element, and FIG. 13, a sectional view along line 13—13 in FIG. 12. As these drawings show, a conventional thin-film capacitor element consists of a stacked structure of a lower electrode 31, a dielectric layer 32 and an upper electrode 33 formed over a substrate 30, and the capacitance of the capacitor is determined by the range in which the lower electrode 31 and the upper electrode 33 overlap each other.

The lower electrode 31 is formed of Cu or the like sputtered or plated over the substrate 30 and etched into a desired pattern shape. The dielectric layer 32 is formed of $SiO_2$ or the like sputtered or chemical vapor-deposited over the lower electrode 31 and the substrate 30 and etched into a desired pattern shape. The patterned dielectric layer 32 extends to over the substrate 30 via the top face and side faces of the lower electrode 31. The upper electrode 33 is formed of Cu or the like sputtered or plated over the dielectric layer 32 and the substrate 30 and etched into a desired pattern shape. The patterned upper electrode 33 extends to over the substrate 30 via the top face and side faces of the dielectric layer 32.

Incidentally, one of the requirements for such a thin-film capacitor element concerns the breakdown voltage between the lower electrode 31 and the upper electrode 33. If this breakdown voltage is below the required level, the thin-film capacitor element will be broken down at a low voltage and can no longer operate as such. The breakdown voltage is heavily dependent on the thickness of the dielectric layer 32 intervening between the two electrodes 31 and 33. Increasing the thickness of the dielectric layer 32 would raise the breakdown voltage, but in the conventional thin-film capacitor element described above the dielectric layer 32 becomes thinner near the corners of the lower electrode 31 (see section P in FIG. 13) and thereby invites a drop of the breakdown voltage. This is due to the circumstance that when the dielectric layer 32 is formed over a level gap resulting from the etching of the lower electrode 31, the coverage of the dielectric layer 32 is adversely affected near the corners of the lower electrode 31. Especially where the dielectric layer 32 is formed by sputtering, it is difficult for sputtered atoms to adhere to the vertical face of the substrate 30 with the consequence that a drop or fluctuations of the breakdown voltage become conspicuous.

Although the dielectric layer 32 can be improved by thinning the lower electrode 31 to reduce the level gap, the thinner the lower electrode 31 and the upper electrode 33, the greater the resistance component of conductors in series, which would give rise to another problem of an lowered Q value of the thin-film capacitor element. Or if the overall thickness of the dielectric layer 32 is increased, the breakdown voltage can be prevented from dropping, but the thicker the dielectric layer 32, the smaller its capacitance per unit square measure. Accordingly, the thin-film capacitor element will become bigger and, moreover, as a greater thickness of the dielectric layer 32 does not serve to stabilize the shape of coverage, fluctuations of the breakdown voltage will remain.

In the conventional thin-film capacitor element described above, the capacitance of the capacitor is determined by the range in which the lower electrode 31 and the upper electrode 33 overlap each other (the rectangle of B×C in FIG. 12). When the lower electrode 31 and the upper electrode 33 are etched into a desired pattern shape, the size and alignment of the two electrodes 31 and 33 tend to be adversely affected in accuracy by fluctuations in side etching quantity and etch rate, giving rise to a problem of fluctuations in the capacitance of the capacitor element. This problem is more serious with thin-film capacitor elements of smaller capacitances, because a smaller capacitance means a smaller area of overlap between the lower electrode 31 and the upper electrode 33 and accordingly the impact of accuracy fluctuations of etching and overlapping on the capacitance increases in relative terms.

Although an alumina substrate used in this kind of electronic circuit board has the aforementioned advantages, at the same time it is inferior in surface smoothness to sapphire and other monocrystalline substrates. The surface roughness (Ra) of an alumina substrate of 99.5% in purity, for instance, is 30 to 100 nm in terms of unevenness. As a consequence, when a capacitor element film is formed over an alumina substrate whose surface smoothness is so poor, the thickness of the dielectric layer formed over the lower electrode becomes partly thin, resulting in a problem of a significantly lowered breakdown voltage.

In view of this problem, in order to smoothen the alumina substrate surface, there are known such methods as mirror-grinding the whole surface of the alumina substrate or coating it with an insulating film of a polymer material or glass. However, the grinding method involves the disadvantages of leaving small dents between crystals in the alumina substrate and moreover, as an alumina substrate is hard, taking a long time. On the other hand, coating with an insulating film creates no big problem to the capacitor element, which is a capacitive one among the various filmy circuit elements and transmission lines formed over the insulating film, because the dielectric loss of the insulating film of a polymer or glass, it does, however, invite increased dielectric losses in other resistance elements, inductor element or layers under the transmission lines, which might lead to a deterioration the high frequency performance of the high frequency device.

SUMMARY OF THE INVENTION

In a thin-film capacitor element according to the present invention, a lower electrode and a dielectric layer are successively stacked over a substrate, the periphery of this dielectric layer is covered with an insulating layer having an opening, and an upper electrode formed over this insulating layer is stacked over the dielectric layer within the opening.

This configuration, which ensures insulation between the lower electrode and the upper electrode by the insulating layer covering the dielectric layer, can securely prevent any drop or fluctuation of the breakdown voltage due to inadequate coverage of the dielectric layer. Furthermore, as the opening in the insulating layer determines the capacitance of the capacitor, fluctuations in capacitance can be reduced irrespective of the accuracy of the lower electrode and the upper electrode in size and alignment.

In the above-described configuration, it is preferable to form the insulating layer of a photosensitive resist. The formation of the insulating layer of a photosensitive resist makes possible highly accurate formation of the opening and more effective reduction of capacitance fluctuations.

In the above-described configuration, though it is sufficient to form the dielectric layer at least over the surface of the lower electrode, it is possible to form the dielectric layer continuously from the top and side faces of the lower electrode to the substrate, and in this case, as the lower electrode and the upper electrode are insulated by two layers, i.e. the dielectric layer and the insulating layer, even if the coverage of the dielectric layer is inadequate in the level gap of the lower electrode, any drop or fluctuation of the breakdown voltage can be securely prevented in spite of this inadequate coverage.

Alternatively, it is also possible to form the dielectric layer only over the surface of the lower electrode and part of the insulating layer from the periphery of the dielectric layer to over the substrate. Although in this case insulation between the lower electrode and the upper electrode is accomplished by the insulating layer alone, the formation of part of the insulating layer directly over the substrate can enhance the tightness of the adhesion of the insulating layer.

In the electronic circuit board according to the invention, an insulating layer is formed over part of an alumina substrate, and a capacitor element consisting of a lower electrode, a dielectric layer and an upper electrode stacked successively is formed over this insulating layer, and at least an inductor element and a transmission line are formed, each in a filmy state, over the alumina substrate.

In the electronic circuit board configured in this manner, as fine ups and downs on the surface of the alumina substrate are evened out by the insulating layer, the breakdown voltage of the capacitor element formed in a filmy state over the insulating can be prevented from dropping. Furthermore, as the insulating film which suffers a great dielectric loss does not adversely affect the inductor element and the transmission line, the high frequency performance can be prevented from deteriorating.

In the above-described configuration, it is preferable for the lower electrode and upper electrode of the capacitor element to overlap each other within a boundary defined by (hereinafter referred to as the contour of) the insulating layer, and this disposition can securely prevent the breakdown voltage of the capacitor element from dropping.

Further in the above-described configuration, although it is also possible to pattern glass film coating over the whole alumina substrate surface in a desired shape as a means to partly form an insulating layer over the alumina substrate, it is more preferable to form the insulating layer by exposing to light and developing a positive type photosensitive polymer film, such as a photoresist. In this way, an insulating layer of any desired shape can be obtained more simply and yet more accurately.

Where the circuit elements in the foregoing configuration are to include a resistance element besides a capacitor element and an inductor element, especially where a material having a relatively high specific resistance, such as $TaSiO_2$, is used as the resistance layer of the resistance element, it is preferable from the viewpoint of preventing deterioration of the high frequency performance to form in a filmy state this resistance layer over the surface of the alumina substrate like the inductor element and the transmission line. On the other hand, where a material having a relatively low specific resistance, such as $Ta_2N$, is used as the resistance layer of the resistance element, it is preferable to form in a filmy state this resistance layer over the insulating layer like capacitor element. In this way, although the resistance layer underneath the resistance element somewhat deteriorates the high frequency performance, the resistance of the resistance element formed in a filmy state over the insulating layer can be prevented from fluctuating substantially, because fine ups and downs of the alumina substrate are smoothened by the insulating layer.

DETAILED DESCRIPTION OF THE PREFERRED EMBODIMENT

Figure 1:
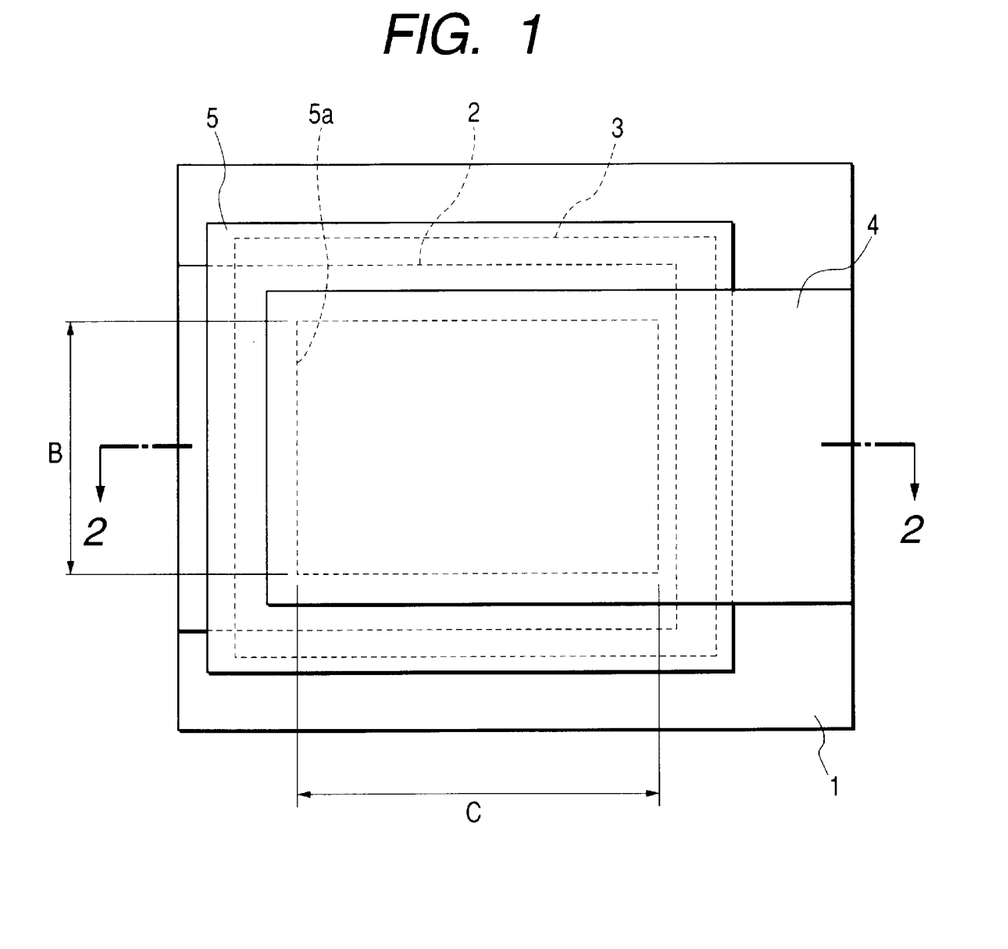
FIG. 1 shows a plan of a thin-film capacitor element, which is a first preferred embodiment of the present invention.
Figure 2:
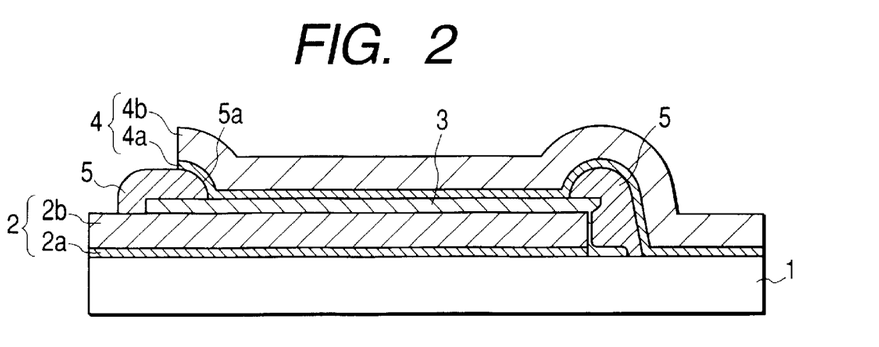
FIG. 2 shows a section along line 2—2 in FIG. 1.

To describe a thin-film capacitor element, which is a preferred embodiment of the present invention with reference to drawings, FIG. 1 shows a plan of the first preferred embodiment of the invention, FIG. 2 shows a section along line 2—2 in FIG. 1, and FIGS. 3 and 4 illustrate a production process of this thin-film capacitor element.

As illustrated in FIGS. 1 and 2, the thin-film capacitor element embodying the invention in this mode is configured of a lower electrode 2, a dielectric layer 3, an upper electrode 4 and an insulating layer 5 arranged to intervene between the periphery of the insulating layer 5 and the upper electrode 4, wherein the upper electrode 4 is stacked over the dielectric layer 3 within an opening 5a formed in the insulating layer 5.

The substrate 1 is made of alumina (of 99.5% in purity for instance), over which the lower electrode 2 is formed of a thin film by sputtering or plating. The lower electrode 2 consists of a first lower electrode layer 2a and a second lower electrode layer 2b, and its overall thickness is set in a range of 0.5 to 5 μm with a view to achieve a high Q value. The first lower electrode layer 2a is formed by sputtering Ti/Cu, for instance, on the substrate 1 and etching it into a desired pattern shape, while the second lower electrode layer 2b is formed by plating the surface of the first lower electrode layer 2a with Cu/Ni for example.

Over the lower electrode 2 is formed the dielectric layer 3 in a filmy state. This dielectric layer 3 is formed by sputtering or chemically vapor-depositing $SiO_2$, for instance, over the second lower electrode layer 2b and the substrate 1 and etching it into a desired pattern shape. The patterned dielectric layer 3 extends to over the substrate 1 via the top face and side faces of the lower electrode 2. In this case, as the dielectric layer 3 is formed in the level gap part of the lower electrode 2 (the first lower electrode layer 2a and the second lower electrode layer 2b), the coverage of the dielectric layer 3 is inadequate in that part.

The periphery of the dielectric layer 3, including this part of inadequate coverage, is covered by the insulating layer 5, and the rest of the dielectric layer 3 is positioned within the rectangular opening 5a formed in the insulating layer 5. This insulating layer 5 is formed by spin-coating the dielectric layer 3 all over from above with a positive type photoresist, for example, and exposing to light and developing the photoresist into a desired pattern. The opening 5a is formed in the patterned insulating layer 5.

Over the insulating layer 5 is formed the upper electrode 4 of a thin film by sputtering or plating, and the upper electrode 4 is stacked over the dielectric layer 3 within the opening 5a. This upper electrode 4 consists of a first upper electrode layer 4a and a second upper electrode layer 4b, and its overall thickness is set in a range of 0.5 to 5 μm with a view to achieve a high Q value. The first upper electrode layer 4a is formed by sputtering Ti/Cu, for instance, all over the insulating layer 5 and etching it into a desired pattern shape, while the second upper electrode layer 4b is formed by plating the surface of the first upper electrode layer 4a with Cu/Ni for example.

Next will be described the production process of the thin-film capacitor element configured as described above mainly with reference to FIGS. 3 and 4.

Figure 3A:
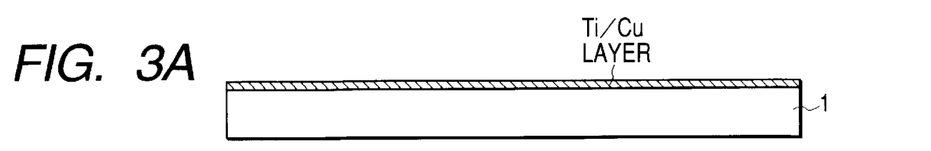
FIG. 3 illustrates a production process of the thin-film capacitor element.
Figure 3B:
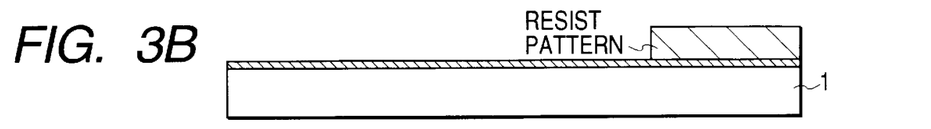
Figure 3C:
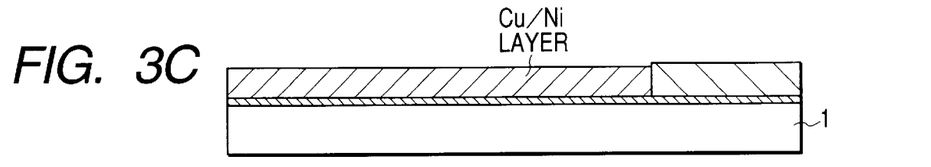
Figure 3D:
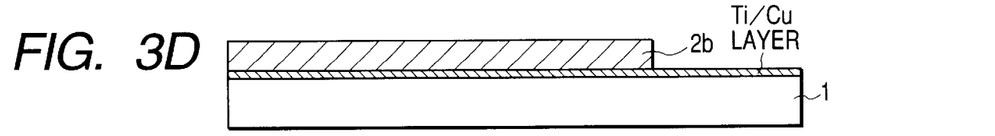
Figure 3E:
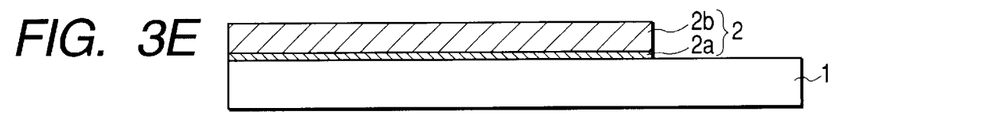

First to form the lower electrode 2, as shown in FIG. 3A, films of Ti (0.1 μm) and Cu (0.1 μm) are successively sputtered over the substrate 1 to form a Ti/Cu layer, followed by spin-coating of a positive type photoresist (a product of Clariant: AZ-P4620) over this Ti/Cu layer. Exposure to light and development of this photoresist results in a resist pattern of a desired shape as shown in FIG. 3B. Next, as illustrated in FIG. 3C, films of Cu (3 μm) and Ni (0.3 μm) are electroplated successively to form a Cu/Ni layer over the Ti/Cu layer, followed by the formation of the second lower electrode layer 2b by peeling off the resist pattern as shown in FIG. 3D. After that, by dry-etching (milling) the Ti/Cu layer, the lower electrode 2 consisting of the first lower electrode layer 2a and the second lower electrode layer 2b is formed over the substrate 1 as illustrated in FIG. 3E.

Figure 3F:
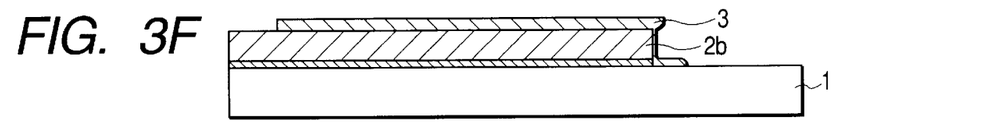

Next to form the dielectric layer 3, an $SiO_2$ (0.3 μm) film is sputtered over the second lower electrode layer 2b and the substrate 1 including the level gap part of the lower electrode 2, and this $SiO_2$ film is etched using a positive type photoresist (a product of Tokyo Ohka Kogyo: OFPR-7450) to form the dielectric layer 3 continuously to the substrate 1 via the top and side faces of the lower electrode 2 as illustrated in FIG. 3F. In this case, as described above, because the dielectric layer 3 is formed in the level gap part of the lower electrode 2 as well, the coverage of the dielectric layer 3 is inadequate in that part.

Figure 3G:
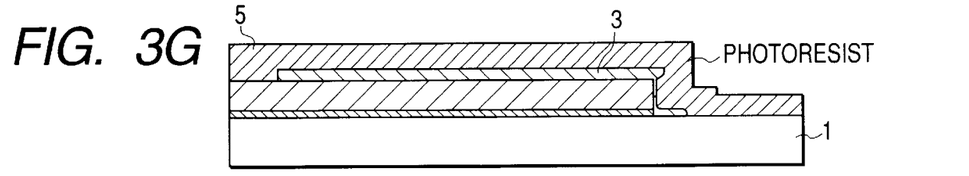
Figure 3H:
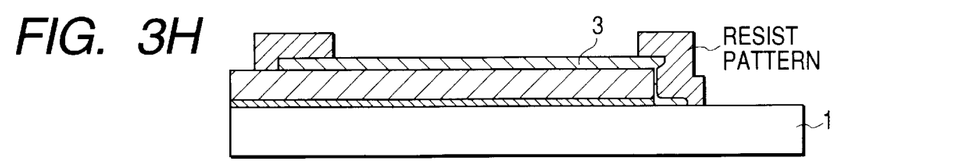
Figure 3I:
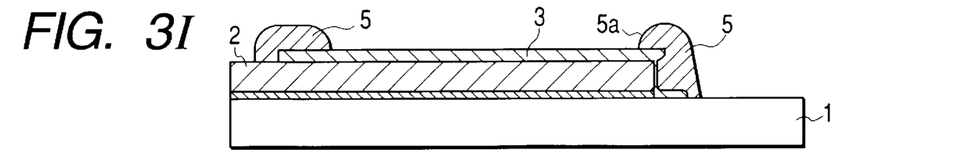

Then to form the insulating layer 5, after spin-coating the dielectric layer 3 with a positive type photoresist (a product of Clariant: AZ-P4620) all over as shown in FIG. 3G, the footrest is patterned to a desired shape by exposure to light and development as shown in FIG. 3H, followed by curing (at 240° C. for 60 minutes). The result is the insulating layer 5 having the opening 5a as shown in FIG. 3I. As the pattern shape of the insulating layer 5 in this case is dependent on the precision of masking during the exposure of the photoresist, the opening 5a can be formed highly accurately. Since the periphery of the dielectric layer 3 is covered with the insulating layer 5 including its inadequately covered part as described above, the end face of the lower electrode 2 (level gap part) is covered with two layers, i.e. the dielectric layer 3 and the insulating layer 5.

Figure 4A:
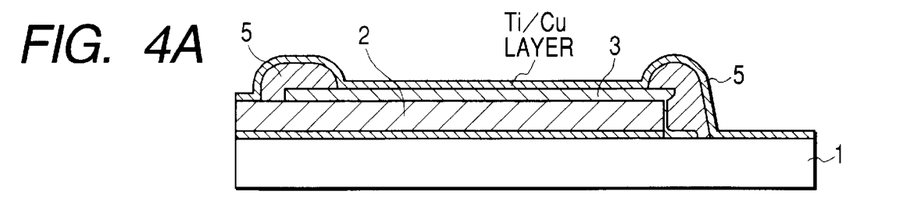
FIG. 4 further illustrates the production process of the thin-film capacitor element.
Figure 4B:
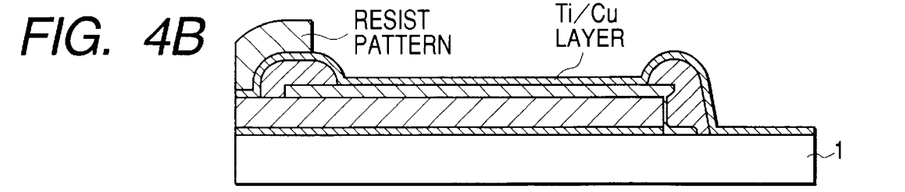
Figure 4C:
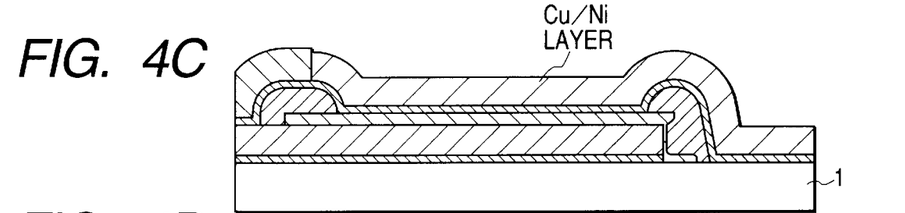
Figure 4D:
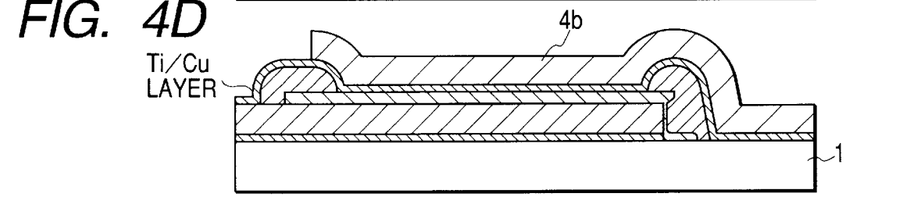
Figure 4E:
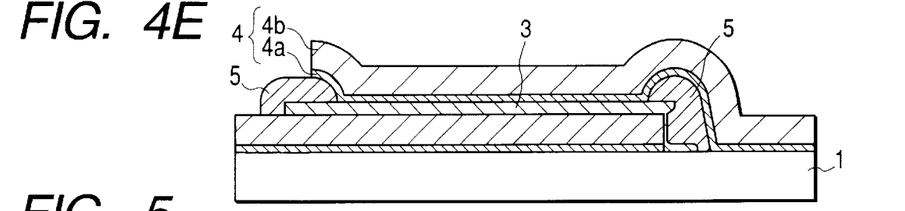

Next to form the upper electrode 4, as shown in FIG. 4A, films of Ti (0.1 μm) and Cu (0.1 μm) are successively sputtered all over the insulating layer 5 to form a Ti/Cu layer, followed by spin-coating of a positive type photoresist (a product of Clariant: AZ-P4620) over this Ti/Cu layer. Exposure to light and development of this photoresist results in a resist pattern of a desired shape as shown in FIG. 4B. Then, as illustrated in FIG. 4C, films of Cu (3 μm) and Ni (0.3 μm) are electroplated successively to form a Cu/Ni layer over the Ti/Cu layer, followed by the formation of the second upper electrode layer 4b by peeling off the resist pattern as shown in FIG. 4D. Finally, by dry-etching (milling) the Ti/Cu layer, the upper electrode 4 consisting of the first upper electrode layer 4a and the second upper electrode layer 4b is formed as shown in FIG. 4E to provide the thin-film capacitor element illustrated in FIGS. 1 and 2.

Thus, in the thin-film capacitor element, which is the first preferred embodiment of the invention, as the lower electrode 2 and the upper electrode 4 are completely insulated from each other by the insulating layer 5 covering the periphery of the dielectric layer 3, any drop or fluctuation of the breakdown voltage can be prevented without fail in spite of this inadequate coverage of the dielectric layer 3. Therefore, it is made possible to achieve a high Q value by increasing the thicknesses of the lower electrode 2 and the upper electrode 4 and at the same time to make the shape of the thin-film capacitor element smaller by reducing the thickness of the dielectric layer 3. Furthermore, as the capacitance of the capacitor is determined by the opening 5a of the insulating layer 5 (the rectangle of B×C in FIG. 1), any fluctuations in capacitance can be reduced irrespective of any adverse effects on the upper electrode 2 and the lower electrode 4 in size or alignment accuracy by fluctuations in side etching quantity and etch rate. Moreover, as a result of the formation of the insulating layer 5 using a photoresist, the opening 5a of the insulating layer 5 can be formed with high precision, making it possible to reduce fluctuations in capacitance even more effectively.

Figure 5:
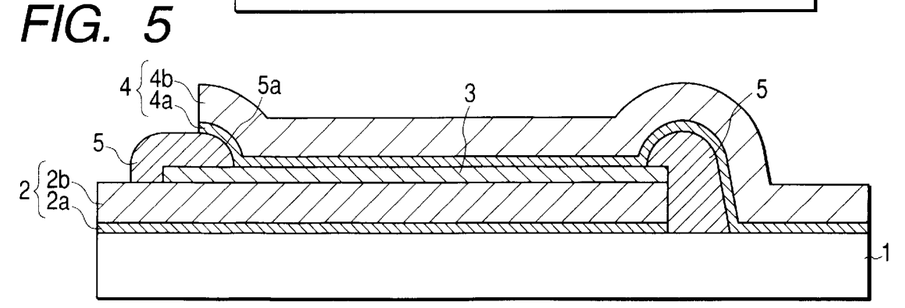
FIG. 5 shows a section of a thin-film capacitor element, which is a second preferred embodiment of the invention.

FIG. 5 shows a section of a thin-film capacitor element, which is a second preferred embodiment of the invention. This thin-film capacitor element differs from the above-described first embodiment in that the dielectric layer 3 is formed only over the surface of the lower electrode 2, and part of the insulating layer 5 covering the periphery of this dielectric layer 3 is extended to above the substrate 1. The two embodiments are basically the same in all the other aspects of configuration.

In the thin-film capacitor element configured in this way, whereas the insulating layer 5 is formed over only the end face (level gap part) of the lower electrode 2, this insulating layer 5 ensures insulation between the lower electrode 2 and the upper electrode 4, resulting in a similar effect to that of the above-described first embodiment. Moreover, as part of the insulating layer 5 can be formed directly over the substrate 1, the adhesion between the insulating layer 5 and the substrate 1 can be made even tighter.

Although the lower electrode 2 is formed directly over the substrate 1 in both of the embodiments described above, the surface of the substrate 1 may as well be coated with an insulating layer to have this insulating layer formed between the lower electrode 2 and the substrate 1.

Next will be described an electronic circuit board according to the present invention.

Figure 6:
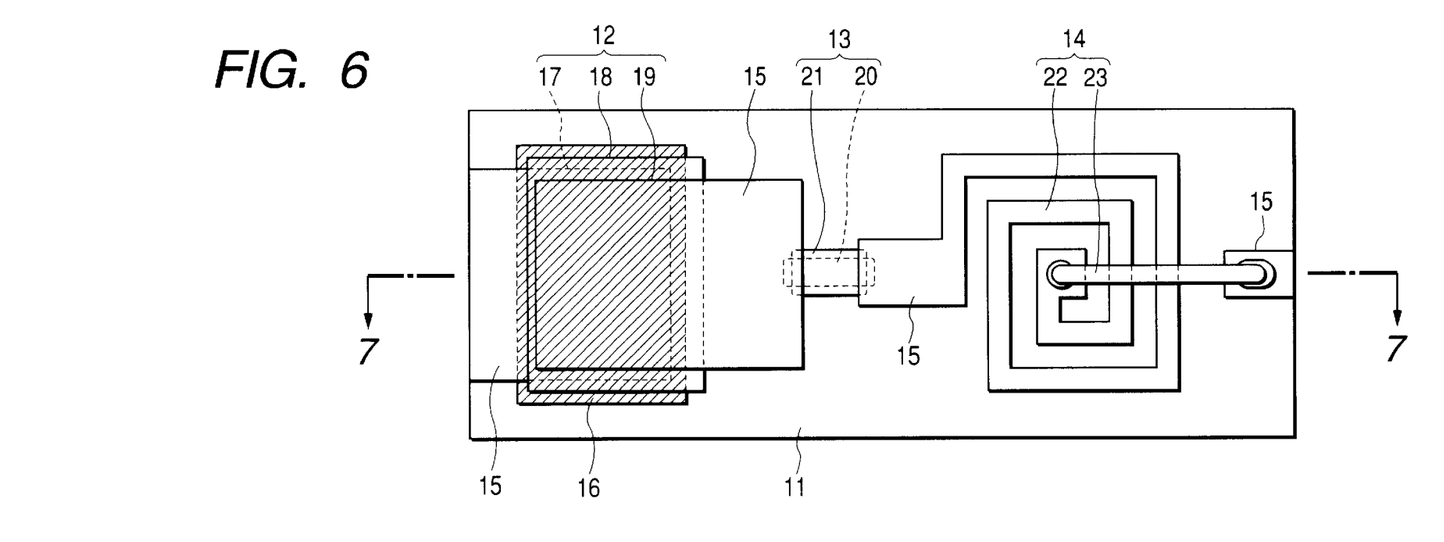
FIG. 6 shows a plan of an essential part of an electronic circuit board, which is a third preferred embodiment of the invention.
Figure 7:
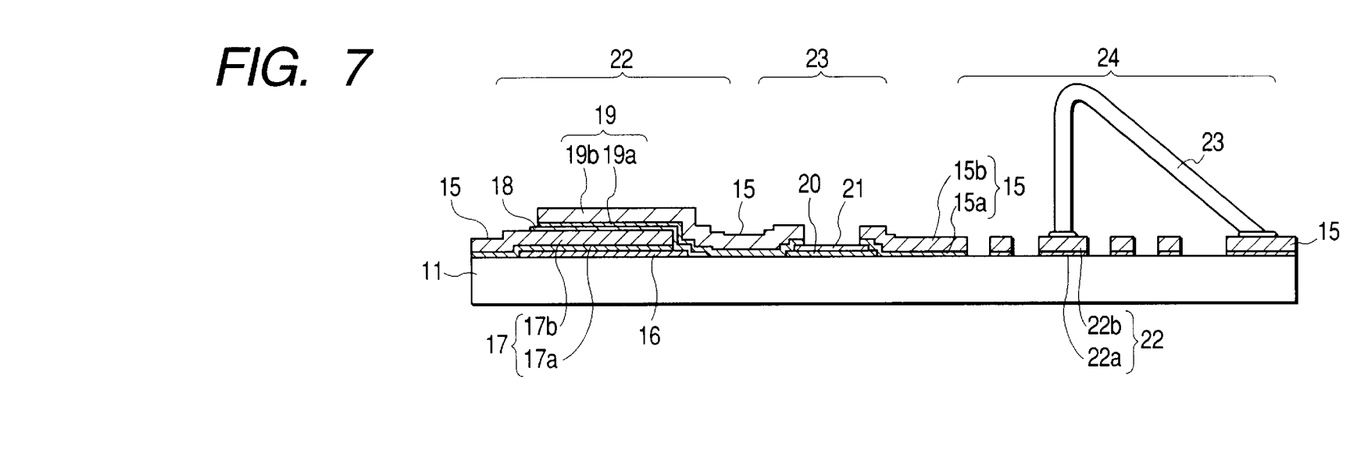
FIG. 7 shows a section along line 7—7 in FIG. 6.

FIGS. 6 and 7 illustrate the electronic circuit board in which circuit elements including a capacitor element 12, a resistance element 13 and an inductor element 14 and transmission lines linking these circuit elements are formed each in a filmy state over an alumina substrate 11. Many of these circuit elements 12, 13 and 14 and transmission lines 15 are formed in the effective area of the alumina substrate 11 according to the requirements of each particular circuit configuration, and FIGS. 6 and 7 illustrate only part of them.

The surface roughness (Ra) of the alumina substrate 11 has ups and downs of about 30 to 100 nm, and this unevenness is due to the porous sintered material of the alumina substrate 11 and the resultant existence of many fine dents in its surface. Over part of the alumina substrate 11 is formed an insulating layer 16, and the filling of the many fine dents in the surface of the alumina substrate 11 with this insulating layer 16 serves to reduce the surface roughness (Ra) of the insulating layer 16 to 10 nm or less. The insulating layer 16, consisting of a positive type photosensitive polymer film such as a photoresist, is formed by exposing to light and developing the film to a desired pattern shape using a mask.

The capacitor element 12 is configured of a lower electrode 17, a dielectric layer 18 and an upper electrode 19 successively stacked over the insulating layer 16, within which the lower electrode 17 and the upper electrode 19 are caused to overlap each other within the insulating layer 16 to serve as the effective area of the capacitor. Herein, if the contour of the insulating layer 16 proves too large for the effective area of the capacitor, the two-dimensional proportion of the insulating layer 16 in the limited space over the alumina substrate 11 will increase, resulting in a contraction of the effective area for circuit elements that can be formed over the alumina substrate 11 and accordingly in a reduced area efficiency. Conversely, if the contour of the insulating layer 16 is reduced just to match the effective area of the capacitor, there will arise a fear that the effective area of the capacitor cannot be formed within the contour of the insulating layer 16 on account of fluctuations in the precision of masks to be used at various steps to be described below. In view of this risk, in this embodiment the contour of the insulating layer 16 is set to be 10 to 100 $\mu$m greater than the designed value of the effective area of the capacitor.

Out of the constituent elements of the capacitor element 12, the lower electrode 17 is a double structure of a first lower electrode layer 17a and a second lower electrode layer 17b, and its total thickness is set within the range of 0.5 to 5 $\mu$m with a view to achieving a high Q value. The first lower electrode layer 17a consists of a metallic film of Ti/Cu or the like formed in a filmy state by sputtering over the insulating layer 16, and the second lower electrode layer 17b consists of a metallic film of Cu/Ni or the like formed in a filmy state by plating over the first lower electrode layer 17a. The dielectric layer 18, consisting of a dielectric film of $SiO_2$ or the like formed in a filmy state by sputtering or chemical vapor deposition (CVD) over the first lower electrode layer 17a of the lower electrode 17, covers the level gap part of the lower electrode 17 (the first lower electrode layer 17a and the second lower electrode layer 17b). The upper electrode 19 also is a double structure of a first upper electrode layer 19a and a second upper electrode layer 19b, and its total thickness is set within the range of 0.5 to 5 $\mu$m with a view to achieving a high Q value. The first upper electrode layer 19a consists of a metallic film of Ti/Cu or the like formed in a filmy state by sputtering over the dielectric layer 18, and the second upper electrode layer 19b consists of a metallic film of Cu/Ni or the like formed in a filmy state by plating over the first upper electrode layer 19a.

The resistance element 13 consists of a resistance layer 20 and an insulation protective layer 21 successively stacked over the alumina substrate 11, and both ends of the resistance layer 20 are connected to the transmission line 15. The resistance layer 20 consists of a resistant material having a relatively high specific resistance, such as $TaSiO_2$, and is formed in a filmy state by sputtering over the alumina substrate 11. The insulation protective layer 21, consisting of a positive type photosensitive polymer film such as a photoresist, is formed so as to cover the surface of the resistance layer 20. As will be described later, the insulating layer 16 underneath the capacitor element 12 and this insulation protective layer 21 are formed at the same step.

The inductor element 14 is configured of a conductor film 22 formed in a filmy state over the alumina substrate 11 and a bonding wire 23 connecting its two ends, which are connected to the transmission line 15 The conductor film 22, formed in a rectangular spiral shape, is a double structure of a first conductor layer 22a and a second conductor layer 22b. The transmission line 15, too, is a double structure of a first conductor layer 15a and a second conductor layer 15b, and these conductor film 22 and transmission line 15 consist of respectively the same materials as the above-described lower electrode 17 and upper electrode 19 of the capacitor element 12. Thus, the first conductor layers 15a and 22a consist of a metallic film of Ti/Cu or the like formed in a filmy state by sputtering over the alumina substrate 11, and the second conductor layers 15b and 22b consist of a metallic film of Cu/Ni or the like formed in a filmy state by plating over the first upper conductor layers 15a and 22a.

Next will be described the production process of the electronic circuit board configured as described above, mainly of the capacitor element 12 and the resistance element 13, with reference to FIGS. 8 and 9.

Figure 8A:
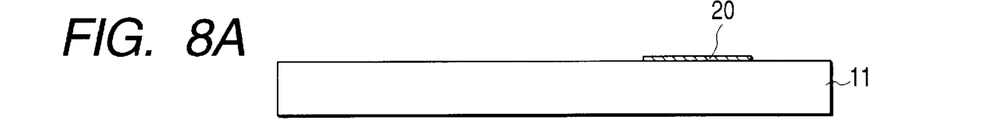
FIG. 8 illustrates a production process of the electronic circuit board.

First a film of TaSiO$_2$ is formed by sputtering over the alumina substrate 11, and a rectangular resistance layer 20 is formed over the alumina substrate 11 as shown in FIG. 8A by etching the film by RIE after patterning a photoresist. As TaSiO$_2$ is a resistant material having a relatively high specific resistance, a desired level of resistance can be achieved even if the resistance layer 20 is made thick enough, and the formation of the resistance layer 20 directly over the alumina substrate 11 would not invite substantial fluctuations in resistance due to fine ups and downs of the surface of the alumina substrate 11.

Figure 8B:
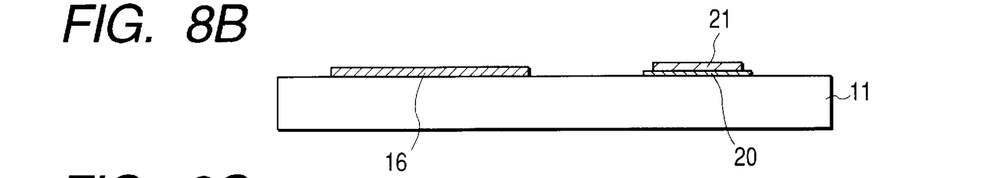

Then, from above the resistance layer 20, the alumina substrate 11 is spin-coated all over with a positive type photoresist (a product of Clariant: AZ-P4620) and, after patterning it into a desired shape by exposure to light and development using a mask, it is subjected to curing (at 240° C. for 60 minutes) to form the insulating layer 16 in a prescribed position on the alumina substrate 11 as shown in FIG. 8B. At the same time, the insulation protective layer 21 is formed over the resistance layer 20.

Figure 8C:
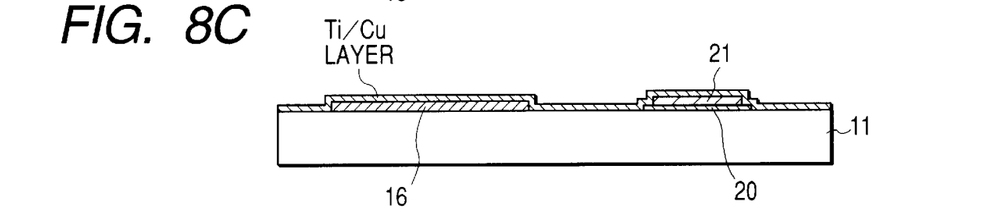
Figure 8D:
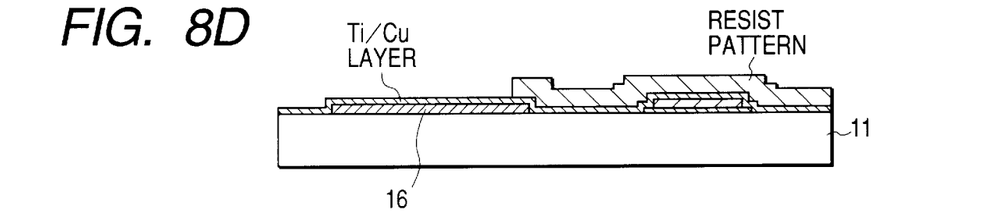
Figure 8E:
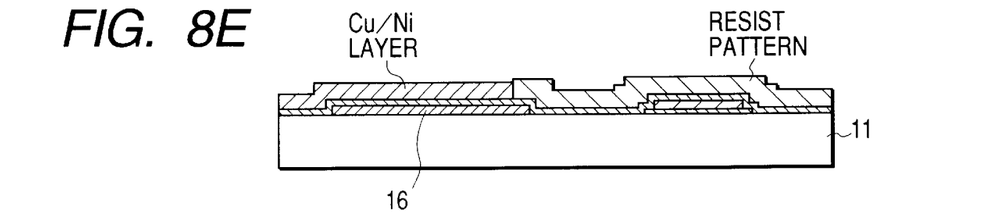
Figure 8F:
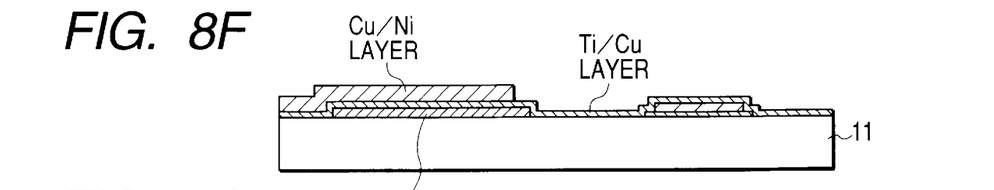
Figure 8G:
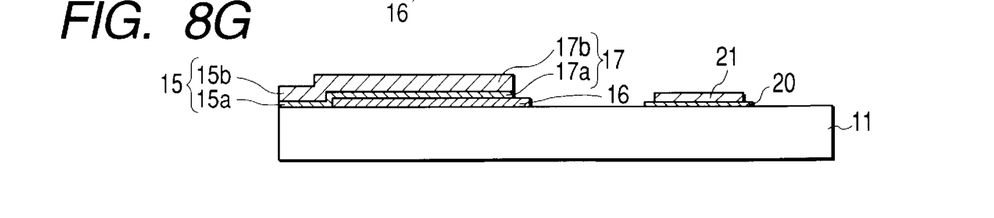

Next, as shown in FIG. 8C, from above the insulating layer 16 and the insulation protective layer 21 films of Ti (0.1 μm) and Cu (0.1 μm) are successively sputtered all over the alumina substrate 11, followed by spin-coating of a positive type photoresist (a product of Clariant: AZ-P4620) over this Ti/Cu layer. Exposure to light and development of this photoresist results in a resist pattern of a desired shape as shown in FIG. 8D. Then, as illustrated in FIG. 8E, films of Cu (3 μm) and Ni (0.3 μm) are electroplated successively to form a Cu/Ni layer over the Ti/Cu layer, followed by peeling off the resist pattern as shown in FIG. 8F, further followed by dry-etching (milling) the Ti/Cu layer. This results in the formation of the lower electrode 17 consisting of the first lower electrode layer 17a and the second lower electrode layer 17b over the alumina substrate 11 as shown in FIG. 8G, and at the same time the transmission line 15 (the first conductor layer 15a and the second conductor layer 15b), which is the guiding pattern of this lower electrode 17, is also formed.

Figure 9A:
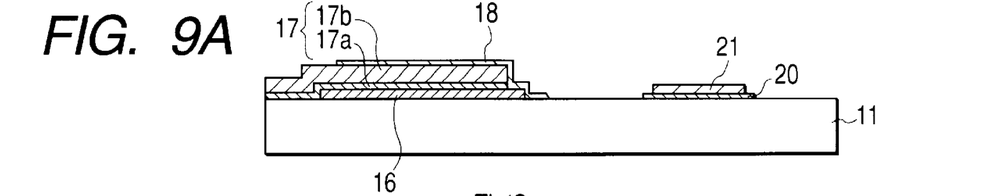
FIG. 9 further illustrates the production process of the electronic circuit board.

Then, from over the lower electrode 17 and the insulation protective layer 21 is formed an SiO$_2$ layer (0.3 μm) by sputtering and, by etching this SiO$_2$ layer by RIE after the patterning of a positive type photoresist (a product of Tokyo Ohka Kogyo: OFPR-7450), the dielectric layer 18 continuous from the top and side faces of the lower electrode 17 and the alumina substrate 11 is formed as illustrated in FIG. 9A.

Figure 9B:
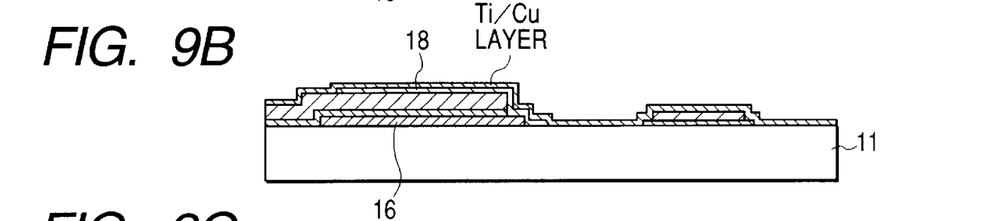
Figure 9C:
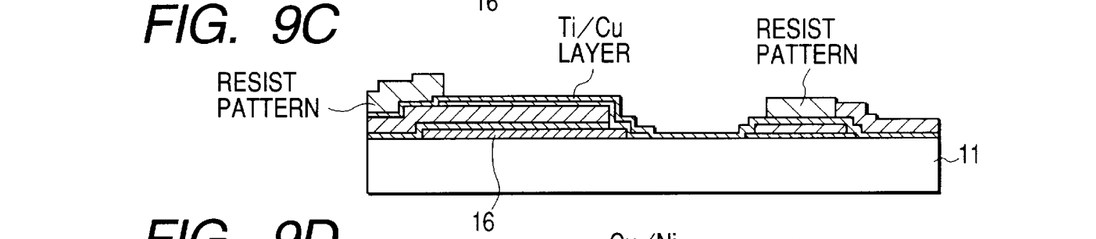
Figure 9D:
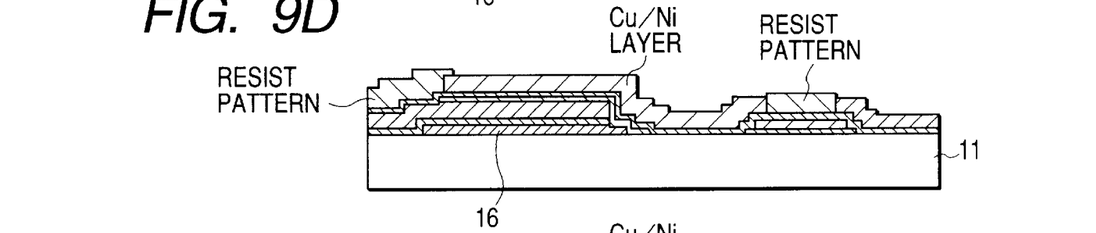
Figure 9E:
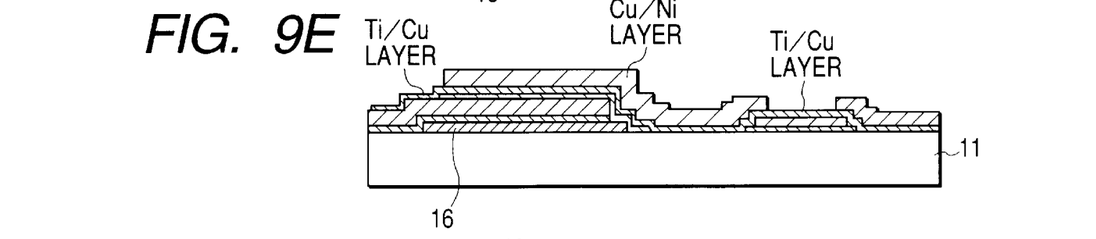
Figure 9F:
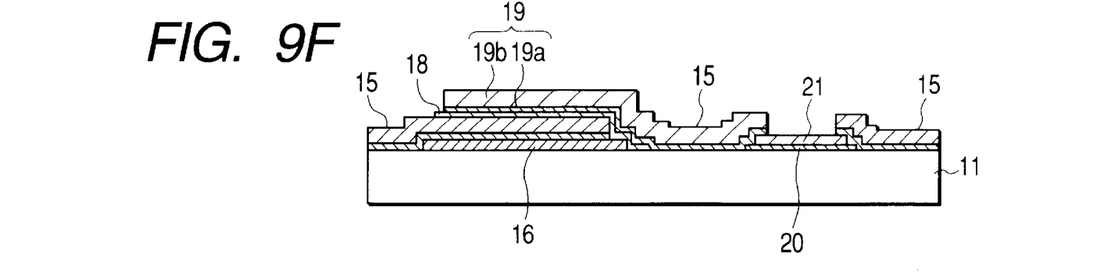

Next, as shown in FIG. 9B, from above the dielectric layer 18 and the insulation protective layer 21 films of Ti (0.1 μm) and Cu (0.1 μm) are successively sputtered to form a Ti/Cu layer, followed by spin coating of a positive type photoresist (a product of Clariant: AZ-P4620) over this Ti/Cu layer, and this photoresist is exposed to light and developed to form a resist pattern of a desired pattern as shown in FIG. 9C. Further, as illustrated in FIG. 9D, films of Cu (3 μm) and Ni (0.3 μm) are successively formed over the Ti/Cu layer by electroplating to form a Cu/Ni layer, followed by peeling off the resist pattern as shown in FIG. 9E. Finally, by dry-etching (milling) the Ti/Cu layer, the upper electrode 19 consisting of the first upper electrode layer 19a and the second upper electrode layer 19b is formed as shown in FIG. 9F, and at the same time the transmission line 15 (the first conductor layer 15a and the second conductor layer 15b), which is the guiding pattern of this upper electrode 19 and the resistance layer 20, is also formed.

To add, although the foregoing description did not touch on the production process of the inductor element 13, the conductor film 22 of this inductor element 13 can be formed at the same steps as the upper electrode 19 and the transmission line 15. Thus, the conductor film 22 of the inductor element 13, consisting of the first conductor layer 22a and the second conductor layer 22b, can be formed over the alumina substrate 11 by patterning the Ti/Cu layer and the Cu/Ni layer in a desired pattern, using a resist pattern or the like, at the steps shown in FIGS. 9B through 9F. Therefore, after forming in a filmy state these circuit elements 12 through 14 and the transmission line 15 over the alumina substrate 11, connecting the bonding wire 23 to the conductor film 22 of the inductor element 13 can give the electronic circuit board illustrated in FIGS. 6 and 7.

In the electronic circuit board embodying the invention in this mode, the insulating layer 16 formed over part of the alumina substrate 11 smoothens fine ups and downs of the surface of the alumina substrate 11, and the capacitor element 12 consisting of the lower electrode 17, the dielectric layer 18 and the upper electrode 19 successively stacked over this insulating layer 16 is formed in a filmy state. As a result, the dielectric layer 18 can be formed in a uniform thickness over the lower electrode 17, and the breakdown voltage of the capacitor element 12 can be thereby prevented from dropping. On the other hand, as the resistance layer 20 of the resistance element 13, the conductor film 22 of the inductor element 14 and the transmission line 15 are formed in a filmy state over the surface of the alumina substrate 11 where the insulating layer 16 is not formed, the insulating layer 16, whose dielectric loss is significant, does not adversely affect the resistance element 13, inductor element 14 and transmission line 15, and the high frequency performance can be thereby prevented from deterioration.

Figure 10:
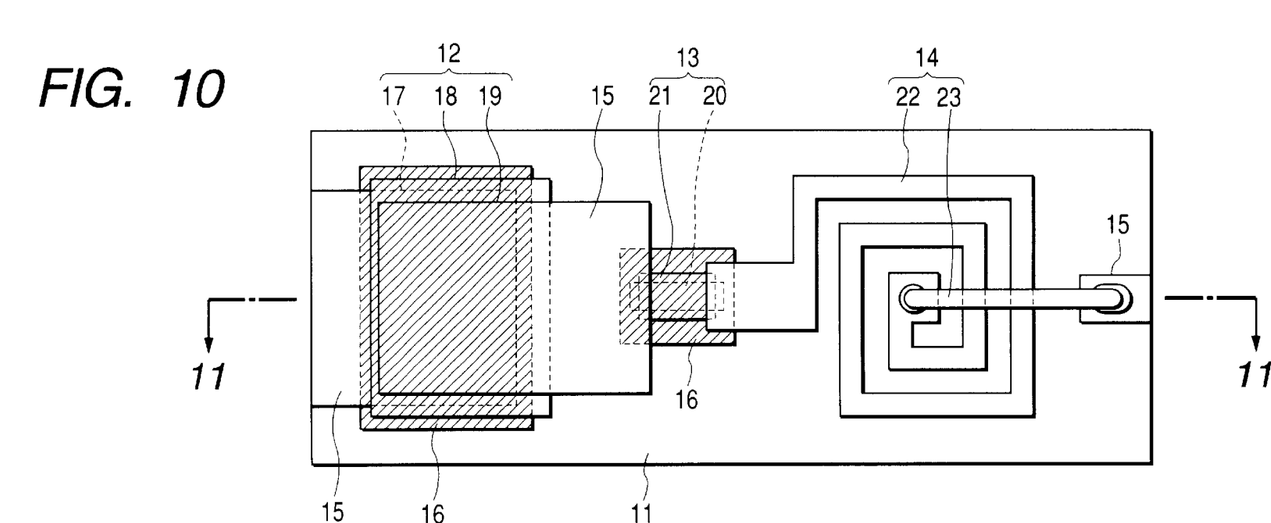
FIG. 10 shows a plan of an essential part of an electronic circuit board, which is a fourth preferred embodiment of the invention.
Figure 11:
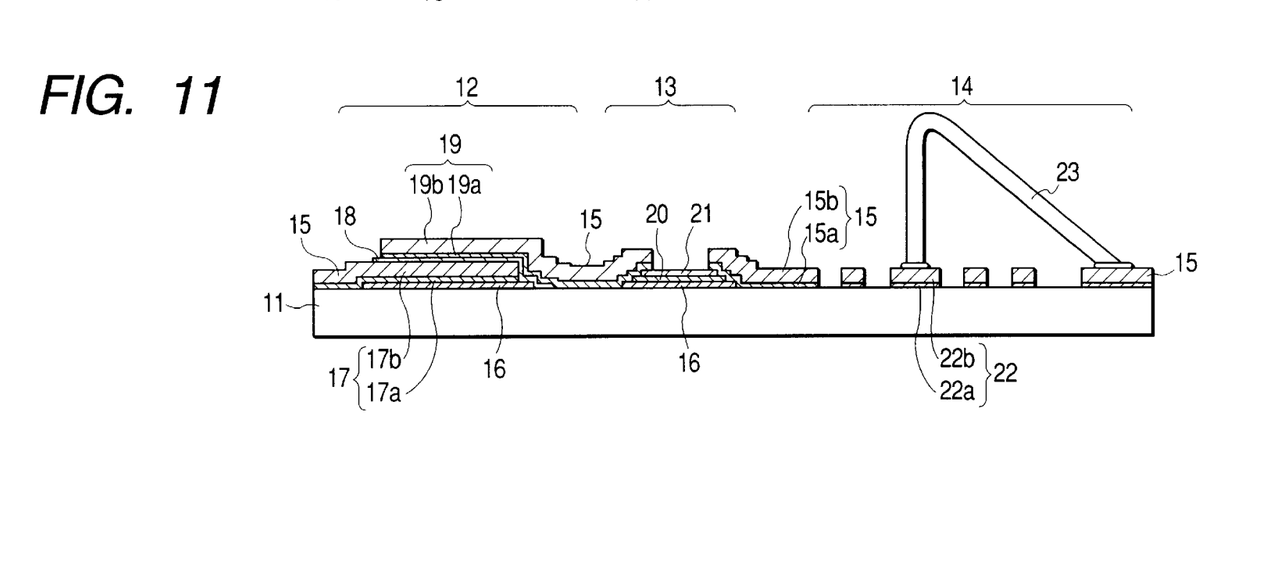
FIG. 11 shows a section along line 11—11 in FIG. 10.

FIG. 10 shows a plan of an essential part of an electronic circuit board, which is another preferred embodiment of the invention, and FIG. 11 shows a section along line 11—11 in FIG. 10. In these drawings, parts having their counterparts in FIGS. 6 and 7 are assigned respectively the same reference signs.

This embodiment differs from the foregoing embodiment in that the resistance layer 20 of the resistance element 13 consists of a material having a relatively low specific resistance, such as Ta$_2$N, and another insulating layer 16 is also formed underneath this resistance layer 20. In all other respects, it is basically the same as the foregoing embodiment. Thus, the lower electrode 17 of the capacitor element 12 and the resistance layer 20 of the resistance element 13 are formed in a filmy state over the insulating layer 16 which is partially formed over the alumina substrate 11, and other elements, i.e. the inductor element 14 and the transmission line 15, are formed in a filmy state over the alumina substrate 11. The resistance layer 20 of the resistance element 13 consists of a material having a relatively low specific resistance, such as Ta$_2$N. It is formed by sputtering, after partially forming the insulating layer 16 over the surface of the alumina substrate 11, a Ta$_2$N film from over the insulating layer 16, and etching it by RIE after patterning a photoresist. Although Ta$_2$N used here is significantly lower in specific resistance than TaSiO$_2$ and the resistance layer 20 is made extremely thin to achieve a desired level of resistance, the resistance level does not significantly fluctuate because fine ups and downs of the surface of the alumina substrate 11 are evened out by the insulating layer 16 formed underneath the resistance layer 20. Incidentally, since the resistance layer 20 is formed in a filmy state over the insulating layer 16, the insulation protective layer 21 to cover the surface of the resistance layer 20 needs to be formed in a separate process from the insulating layer 16.

In the electronic circuit board having such a configuration, as the capacitor element 12 and the resistance element 13 are formed in a filmy state over the insulating layer 16 partially formed over the surface of the alumina substrate 11, it is possible to prevent the breakdown voltage of the capacitor element 12 from dropping. Moreover, in spite of the use of a material having a relatively low specific resistance, such as $Ta_2N$, for the resistance layer 20 of the resistance element 13, the level of resistance can be prevented from fluctuating. Also, though the high frequency performance is somewhat deteriorated by the insulating layer 16 underneath the resistance element 13, the high frequency performance can be prevented from significant deterioration because other elements, i.e. the inductor element 14 and the transmission line 15, are formed in a filmy state over the alumina substrate 11 and accordingly the insulating layer 16, whose dielectric loss is significant, does not adversely affect the inductor element 14 and the transmission line 15.

While, in the above embodiments, the insulating layer 16 is partially formed over the alumina substrate 11 by exposing to light and developing a positive type photosensitive polymer film such as a photoresist, it is also possible to coat the whole surface of the alumina substrate 11 with a glass film and patterning this film in a desired shape to form the insulating layer 16.

Embodied in the above-described modes, the present invention provides the following advantages.

Covering the periphery of a dielectric layer in a thin-film capacitor element with an insulating layer having an opening and stacking an upper electrode over the dielectric layer formed in a filmy state over this insulating layer 16 within the opening results in secure insulation of a lower electrode and the upper electrode by the insulating layer covering the periphery of the dielectric layer. As a result, any drop or fluctuation of the breakdown voltage due to inadequate coverage of the dielectric layer can be prevented without fail. Furthermore, as the opening in the insulating layer determines the capacitance of the capacitor, fluctuations in capacitance can be reduced irrespective of the accuracy of the lower electrode and the upper electrode in size and alignment.

On the other hand, in an electronic circuit board according to the invention, an insulating layer is partially formed over the surface of the alumina substrate; a capacitor element consisting of a lower electrode, a dielectric layer and an upper electrode successively stacked is formed in a filmy state over this insulating layer; and at least an inductor element and a transmission line are formed over the surface of the alumina substrate, each in a filmy state. As a result, because fine ups and downs of the surface of the alumina substrate are smoothened by the insulating layer, the breakdown voltage of the capacitor element formed in a filmy state over the insulating layer can be prevented from dropping. At the same time, as the insulating layer, whose dielectric loss is significant, does not adversely affect the inductor element and the transmission line, the high frequency performance can be prevented from deterioration.

What is claimed is:

1. A thin-film capacitor element comprising:

a substrate;

a lower electrode disposed above the substrate;

a dielectric layer disposed above the lower electrode;

an insulating layer covering a periphery of the dielectric layer, the insulating layer having an opening and comprising a photosensitive resist; and an upper electrode formed over the insulating layer and stacked over the dielectric layer within the opening.

2. The thin-film capacitor element, according to claim 1, wherein the dielectric layer is formed continuously from top and side faces of the lower electrode to the substrate.

3. The thin-film capacitor element, according to claim 1, wherein the dielectric layer is formed only over a surface of the lower electrode, and part of the insulating layer is formed from the periphery of the dielectric layer to the substrate.

4. An electronic circuit board substrate comprising:

a substrate;

an insulating layer formed over part of the substrate, the insulating layer comprising a photosensitive polymer film;

a capacitor element having a lower electrode, a dielectric layer and an upper electrode stacked successively over the insulating layer; and at least an inductor element and a transmission line formed, each as a thin film, over the substrate, wherein the lower electrode and upper electrode overlap each other within a boundary formed by the insulating layer.

5. The electronic circuit board, according to claim 4, wherein a resistance element is further formed as a thin film over a surface of the substrate.

6. The electronic circuit board, according to claim 5, wherein the resistance element comprises one of $Ta_2N$ and $TaSiO_2$.

* * * * *